United States Patent
Hammes et al.

(10) Patent No.: US 8,068,885 B2
(45) Date of Patent: Nov. 29, 2011

(54) METHOD AND CIRCUIT ARRANGEMENT FOR DETERMINING A CHARGE CONSUMED WITHIN A PERIOD IN MOBILE DEVICES

(75) Inventors: Markus Hammes, Dinslaken (DE); Roland Hellfajer, Bochum (DE); Britta Felbecker, München (DE)

(73) Assignee: Infineon Technologies AG, Neubiberg (DE)

( * ) Notice: Subject to any disclaimer, the term of this patent is extended or adjusted under 35 U.S.C. 154(b) by 1230 days.

(21) Appl. No.: 11/371,828

(22) Filed: Mar. 9, 2006

(65) Prior Publication Data

US 2006/0252467 A1 Nov. 9, 2006

Related U.S. Application Data

(63) Continuation of application No. PCT/DE2004/001835, filed on Aug. 18, 2004.

(30) Foreign Application Priority Data

Sep. 9, 2003 (DE) .................................. 103 41 549

(51) Int. Cl.
    *H04B 1/38* (2006.01)
(52) U.S. Cl. ........ 455/572; 455/574; 324/427; 320/132; 715/828; 702/176
(58) Field of Classification Search .................. 455/572, 455/573, 574, 522; 324/427, 432; 607/5; 320/48, 132, 134, 114, 435; 702/176
See application file for complete search history.

(56) References Cited

U.S. PATENT DOCUMENTS

| | | | |
|---|---|---|---|
| 5,065,084 A * | 11/1991 | Oogita | 320/136 |
| 5,594,345 A | 1/1997 | Boehm | |
| 6,236,214 B1 | 5/2001 | Camp, Jr. et al. | |
| 6,898,438 B1 * | 5/2005 | Uchida | 455/522 |
| 6,957,091 B1 * | 10/2005 | Ptasinski et al. | 455/572 |
| 2004/0014489 A1 * | 1/2004 | Miyachi et al. | 455/550.1 |
| 2004/0046565 A1 * | 3/2004 | Ingesson et al. | 324/427 |
| 2004/0098222 A1 * | 5/2004 | Pehrsson et al. | 702/176 |
| 2004/0253996 A1 * | 12/2004 | Chen et al. | 455/574 |
| 2004/0266493 A1 * | 12/2004 | Bahl et al. | 455/574 |
| 2006/0019721 A1 * | 1/2006 | Kuratli | 455/572 |

FOREIGN PATENT DOCUMENTS

EP 0 593 198 A2 4/1994

OTHER PUBLICATIONS

International Search Report, Int'l Application No. PCT/DE2004/001835, Int'l Filing Date Aug. 18, 2004, 2 pgs.

* cited by examiner

*Primary Examiner* — Kamran Afshar
*Assistant Examiner* — Khawar Iqbal
(74) *Attorney, Agent, or Firm* — Eschweiler & Associates, LLC

(57) ABSTRACT

A method for calculating the power consumption of a mobile device, particularly of a mobile station of a mobile radio system, in an observation period $\Delta t$ based on various possible system states $s_k$ in which the device can be in the period $\Delta t$. A value of a quantity $\Delta_k$ is determined system-state-dependently for the system states $s_k$ occurring in the period $\Delta t$. The power consumption in the period $\Delta t$ is calculated in such a manner that the quantities $\Delta_k$ and state-dependent typical currents $i_k$ are taken into consideration.

19 Claims, 2 Drawing Sheets

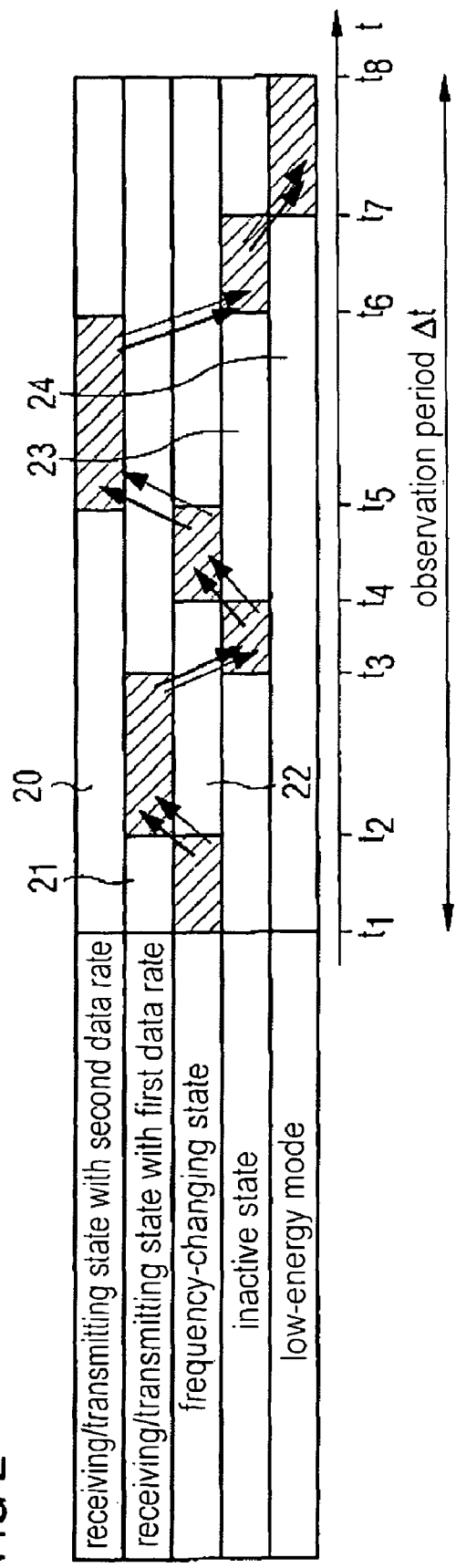

METHOD AND CIRCUIT ARRANGEMENT FOR DETERMINING A CHARGE CONSUMED WITHIN A PERIOD IN MOBILE DEVICES

REFERENCE TO RELATED APPLICATIONS

This application is a continuation of PCT/DE2004/001835, filed on Aug. 18, 2004, which was not published in English, which claims the benefit of the priority date of German Patent Application No. DE 103 41 549.1, filed on Sep. 9, 2003, the contents of both of which are herein incorporated by reference in their entireties.

FIELD OF THE INVENTION

Calculating a consumed charge Q referred to a period $\Delta t$ in a mobile device with mains-independent power supply.

BACKGROUND OF THE INVENTION

The consumed charge Q referred to a period $\Delta t$ can be determined to perform a precalculation of the operating time expected in mobile devices, which are generally operated with a battery or an accumulator.

It will be appreciated that there are differences in power consumption during the operation of mobile stations of digital mobile radio systems. This is at least partially attributable to the existence or non-existence of radio transmission links.

There are two possibilities for calculating power consumption.

First, a current measurement and integration of power variation with time can be used to calculate power consumption. Since, as mentioned above, the power consumption is subject to great fluctuations, the current measurement can be quite complex, requiring a high-resolution analog/digital converter.

A second way to calculate power consumption, which can be applied in packet-oriented mobile radio systems such as, for example, Bluetooth, relates to storing mean power consumption for various packet types. Bluetooth has a large number of packet types for different connections (synchronous/asynchronous) and tasks (connection set-up, pollen etc.). By monitoring the packet types emitted and received, the charge consumed in the observation period can be inferred by adding together the packet-related typical power consumptions. However, this method has the several disadvantages that may affect its accuracy. First, calculating an estimated value for the actual power consumption can be very complex because the packet-typical charge consumption is composed of a number of components. For example, constant components, such as a component which is associated with a packet-linked carrier frequency change, and variable components, which depend on the amount of data transmitted per packet, must be taken into consideration. Additionally, incomplete data packets and/or a nonuniform distribution of the data over various time slots may exist when converting the power consumption from a previous data rate to a current data rate. Also, the system may not be periodic despite a constant data rate. The periodic behavior of the system can, for example, be disturbed by complex software processes or also by externally initiated events.

SUMMARY OF THE INVENTION

The following presents a simplified summary in order to provide a basic understanding of one or more aspects and/or embodiments of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

In one example, a method for determining the power consumption of a mobile device is disclosed. A corresponding circuit arrangement is also disclosed.

It will be appreciated that the term "consumed charge Q referred to a period $\Delta t$" can be interpreted both as change of charge and as mean power consumption in a period $\Delta t$ and is written in a simplifying manner as the term power consumption herein.

The method for calculating a power consumption in a mobile device with mains-independent power supply is based on various possible system states $s_k$ in which the device may be within the observation period $\Delta t$. The method includes determining a value of a quantity $\Delta_k$ for system states $s_k$ occurring within the period $\Delta t$ as a function of the system state, the characteristic quantity $\Delta_k$ describing the period $\Delta t_k$ of a system state $s_k$ within the period $\Delta t$, where the quantities $\Delta_k$ and $\Delta t_k$ can be identical. The method also includes calculating the power consumption in the observation period $\Delta t$ by taking into consideration the characteristic quantities $\Delta_k$ and state-dependent typical currents $i_k$ for the system states occurring in the period $\Delta t$.

The state-dependent calculation enables the power consumption components associated with the states to be used directly for the determination of power consumption.

If large state-dependent differences in power consumption are obtained, a relative accurate determination of the power consumption can be performed by taking into consideration the significant power consumption components associated with corresponding states.

In one example, system states include:
1. a receiving/transmitting state in which the mobile station operates in received mode or in transmit mode, or alternatively;
2. a receiving state in which the mobile station operates in received mode, and a transmitting state in which the mobile station operates in transmit mode;
3. a frequency-changing state in which a change of the carrier frequency is performed in the mobile station;
4. an inactive state in which the mobile station is neither in the receiving/transmitting state or, alternatively, neither in the receiving state nor in the transmitting state nor in the frequency-changing state but the processor of the mobile station is still supplied with clock and voltage; and/or
5. a low-energy mode in which the processor is supplied with reduced or disconnected clock and/or reduced or disconnected voltage.

The few states presented above, make possible a comprehensive state-oriented characterization of the mobile radio device. The power consumption can thus be determined with a small number of state-dependent typical currents $i_k$, i.e. stored in a storage device.

In mobile radio systems operating with frequency hopping, the period in which the mobile station is in a frequency-changing state can amount to a substantial proportion of the observation period $\Delta t$. This is associated with a substantial proportion of the total power consumption. This component can be a relatively large component particularly in systems based on a fast frequency hopping method in which a number of carrier frequencies are used per symbol period, and should therefore be taken into consideration in the calculation of the power consumption.

In one example, the receiving/transmitting state or alternatively the receiving state and/or the transmitting state is subdivided into different receiving/transmitting states or receiving states or transmitting states, respectively, with different data rates.

Taking into consideration a number of receiving/transmitting states or alternatively a number of receiving states or transmitting states with different data rates is desirable because the data rate can be adapted to respective boundary conditions. If, for example, communication is not possible at a given signal/noise ratio and a particular data rate, the data rate is reduced by changing the type of modulation or using a different coding.

In one example, it is assumed that in the case of a number of receiving/transmitting states or alternatively in the case of a number of receiving states and/or transmitting states, different data rates are caused by different symbol rates. In this case, the state-dependent typical currents $i_k$ for these receiving/transmitting states or receiving states and transmitting states, respectively, are proportional to the symbol rates of these states.

In this manner, the power consumption can be calculated easily since due to the known proportionalities, a lesser amount of information with regard to the typical currents $i_k$ needs to be stored in the memory.

In one example, the value of the characteristic quantity $\Delta_k$ of a receiving/transmitting state or alternatively receiving state or transmitting state is determined so that the number of symbols or bits received and transmitted or received or transmitted, respectively, over the period $\Delta t$ is determined in the respective state. The determination of the number of symbols or bits can be performed, in particular, with the aid of a counter which is implemented in hardware or software. If the mobile radio system is a CDMA (code division multiple access) system in which each symbol consists of a number of chips, it is also possible to determine or to count, respectively, the number of chips instead of the number of symbols or bits. When the corresponding number, and thus also the quantity $\Delta_k$, has been determined with the aid of a counter, the corresponding period $\Delta t_k$ can be easily derived from this indirectly when the data rate is known.

In one example, the value of the characteristic quantity $\Delta_k$ of the frequency-changing state is similarly determined by counting the frequency-changing states occurring over the period $\Delta t$. Alternatively, the value of this quantity can be determined by measuring the period $\Delta t_k$, in which the mobile station is in a frequency-changing state, occurring over the period $\Delta t$.

Since generally the carrier frequency is selected via a phase-locked loop (PLL), the pull-in characteristic of the PLL from one carrier frequency to the next carrier frequency can be determined by the characteristic quantities of the PLL, such as bandwidth and attenuation, for example. The resultant pull-in time can be stored in the mobile radio device at the manufacturer or can be determined in operation with the aid of simple analytical equations. The period $\Delta t_k$ is then obtained simply from the pull-in time of the PLL multiplied by the number of frequency-changing states occurring over the period $\Delta t$.

The value of the characteristic quantity $\Delta_k$ for the low-energy state is determined after determining the values of the characteristic quantities $\Delta_k$ for other states occurring in the period $\Delta t$.

The value of the characteristic quantity $\Delta_k$ for the low-energy state, also called LPM (low power mode), can thus be determined without direct measurement during the low-energy state. The indirect determination of the characteristic quantity $\Delta_k$ for the low energy state avoids additional power consumption for current measuring purposes during operation in the lower energy state. In addition, due to the indirect determination, a further counter associated with the low energy state is not necessary.

In one example, one or more state-dependent currents $i_k$ are dependent on one or more further parameters. In particular, the currents $i_k$ can be placed into relation with supply voltage or temperature. In addition, component tolerances can also be taken into consideration by parameterizing state-dependent currents $i_k$.

This provides for increased calculation accuracy. The expenditure needed for this is low since the actual value of the supply voltage and the value of the instantaneous chip temperature are generally available in the mobile radio device or can be easily determined. By including component tolerances, so-called worst- or best-case values (upper or lower limits) can be additionally determined for the power consumption. In addition, charge-specific or even mobile-device-specific influences can also be taken into consideration via the storage of the corresponding characteristics at manufacture.

BRIEF DESCRIPTION OF THE DRAWINGS

The invention is explained in more detail below wherein reference is made to the following drawings.

FIG. 2 is a schematic block diagram illustrating system states and their occurrence in time in an observation period $\Delta t$.

DETAILED DESCRIPTION OF THE INVENTION

Figure 1:
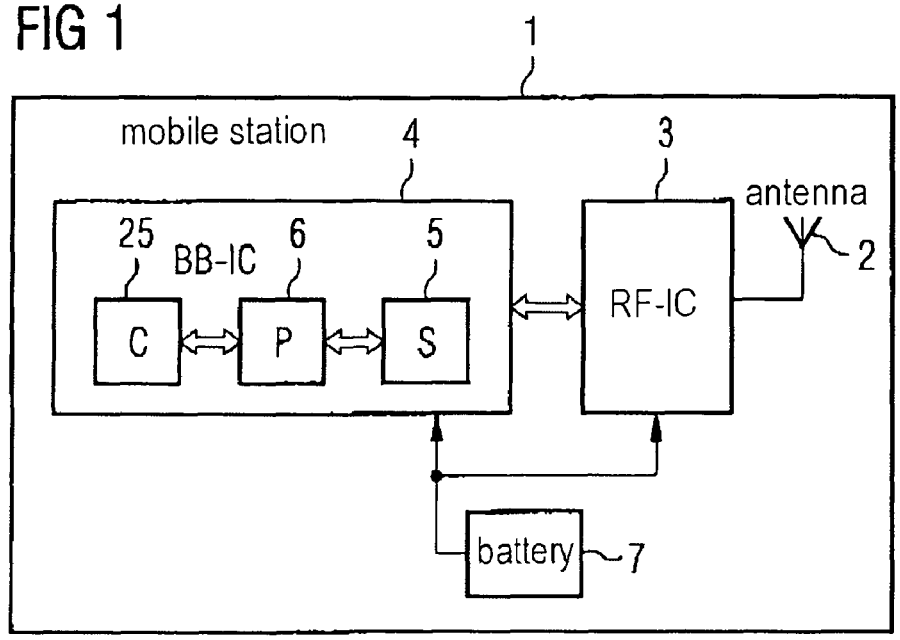
FIG. 1 is a schematic block diagram illustrating a mobile station of a digital mobile radio system.

One or more examples of the present invention will now be described with reference to the drawing figures, wherein like reference numerals are used to refer to like elements throughout. It should be understood that the drawing figures and following descriptions are merely illustrative and that they should not be taken in a limiting sense. In the following description, for purposes of explanation, numerous specific details are set forth in order to provide a thorough understanding. It will be appreciated that variations of the illustrated systems and methods apart from those illustrated and described herein may exist and that such variations are deemed as falling within the scope of the appended claims.

It will be appreciated that the following considerations relate to mobile stations in digital mobile radio systems, particularly Bluetooth or DECT systems. However, it is also to be appreciated that application is not intended to be limited to the field of mobile communications, but is to apply to different types of electrically operated mobile devices.

Turning to FIG. 1, a schematic circuit diagram illustrates the structure of a mobile station 1 configured to measure power consumption.

An antenna 2 is bidirectionally connected to a monolithically integrated radio-frequency chip 3 (RF-IC).

The RF-IC 3 has a bidirectional interface to a monolithically integrated baseband chip 4 (BB-IC). In the BB-IC 4, a processor 5 is electrically connected to a memory 6 and the processor 5 is electrically connected to a counting device 25. A battery 7 is electrically connected to the two chips, the BB-IC and the RF-IC.

In this arrangement, the signals received in the antenna 2 are demodulated or modulated, respectively, in the RF-IC 3. Further processing of the received signals or preprocessing of the signals to be transmitted is performed in the BB-IC 4. This comprises a processor 5, a memory 6 and the counting device 25 which are involved in the calculation of the power consumption. Both chips 3, 4 are supplied with operating voltage by the battery 7.

In addition, the battery also supplies operating voltage for other components of the mobile station 1 which are not shown here. It is assumed that the mobile station can be in one or more of the following states during a period $\Delta t$:

a) in a number of receiving/transmitting states (each state designed as RX-TX phase) in which the mobile station operates in received mode or in transmit mode, the receiving/transmitting states in each case differing in that the information transmission is performed with a different data rate, or b) in a frequency-changing state (also called PLL settle phase), in which a change of the carrier frequency is performed in the mobile station, or c) in an inactive state in which the mobile station is neither in a receiving/transmitting state nor in the frequency-changing state but the processor of the mobile station is still supplied with clock and voltage, or d) in a low-energy mode in which the processor is supplied with reduced or disconnected clock and/or reduced or disconnected voltage.

In the text which follows, it is assumed for the purpose of simplification that only two receiving/transmitting states can exist which have a different data rate.

In FIG. 2, an example of the occurrence of the possible 5 system states 20-24 in the observation period $\Delta t$ is illustrated. From time $t_1$ to time $t_2$, the mobile station is in the frequency-changing state 22. From time $t_2$ to time $t_3$, the mobile station is in a first receiving/transmitting state 21 with a first data rate. Further states are progressively passed through.

To determine the power consumption in the observation period $\Delta t$, the following operations are performed:

1. Counting the number $\Delta_1$ of the frequency-changing states 22 occurring over the period $\Delta t$, via a counter $C_1$ located in the counting device 25, 2. Measuring, with the aid of a counter $C_2$ located in the counting device 25 (for example by counting system cycles), the period $\Delta t_2$ occurring over the period $\Delta t$, in which the mobile station is in an inactive system state 23, where $\Delta_2 = \Delta t_2$, 3. Counting the number $\Delta_3$ of symbols or bits transmitted and received via a counter $C_3$ located in the counting device 25 with regard to the receiving/transmitting state with the first data rate 21, and 4. Counting the number $\Delta_4$ of symbols transmitted and received via a counter $C_4$ located in the counting device 25 with regard to the receiving/transmitting state with the second data rate 20.

Figure 3:
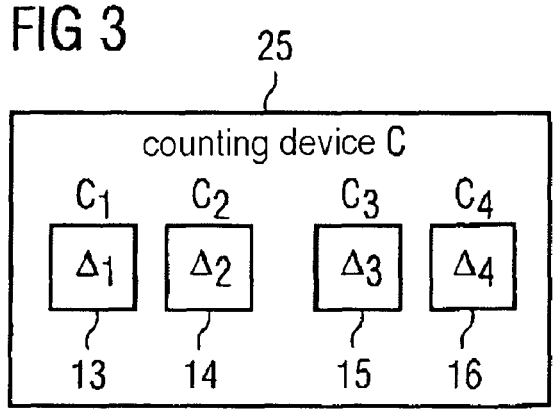
FIG. 3 is a schematic block diagram illustrating a counting device which contains counters $S_1$-$S_4$ and the corresponding counts $\Delta_1$-$\Delta_4$.

FIG. 3 shows the counting device 25 containing the counters $C_1$-$C_4$ 13-16 implemented in hardware, wherein these exhibit corresponding counts $\Delta_1$-$\Delta_4$. If the counters $C_1$-$C_4$ are designed in software (i.e. the counts are performed by the processor 5), the counting device 25 is omitted.

For the results of the operations from 1., 3. and 4., the periods $\Delta t_1$, $\Delta t_3$ and $\Delta t_4$, respectively, to be allocated are determined from the counts $\Delta_1$, $\Delta_3$, $\Delta_4$ present in the counters 13, 15, 16 of the counting device 25 after the period $\Delta t$ in the processor 6.

Assuming that $\Delta_3$ represents the number of symbols, the period $\Delta t_3$ in which the mobile station was in the receiving/transmitting state with the first data rate 21 is obtained as:

$$\Delta t_3 = \Delta_3 \times t_{symbol,1} \quad (1a),$$

where $t_{symbol,1}$ represents the symbol period of the state with a first data rate 21.

If, as an alternative, $\Delta_3$ represents the number of bits, the period $\Delta t_3$ in which the mobile station was in the receiving/transmitting state with the first data rate 21 is obtained as:

$$\Delta t_3 = (\Delta_3/N_1) \times t_{symbol,1} \quad (1b),$$

where $t_{symbol,1}$ represents the symbol period of the state with a first data rate 21 and each symbol contains $N_1$ bits.

The same statements with regard to the counting of symbols or bits apply to determining the period $\Delta t_4$ of the receiving/transmitting state with the second data rate 20. If $\Delta_4$ specifies the number of bits, the corresponding period for the receiving/transmitting state with the second data rate 22 is determined as:

$$\Delta t_4 = (\Delta_4/N_2) \times t_{symbol,2} \quad (2),$$

where $t_{symbol,2}$ represents the symbol period of the state with the second data rate 20 and each symbol then contains $N_2$ bits.

A distinction can be made between two special cases:

1. In the case of different data rates caused by different types of modulation (for example DQPSK modulation and DCPSK modulation) the following applies:

$$t_{symbol,1} = t_{symbol,2} \text{ and } N_1 \neq N_2 \quad (3).$$

2. In the case of different data rates caused by different symbol rates, the following applies:

$$t_{symbol,1} \neq t_{symbol,2} \text{ and } N_1 = N_2 \quad (4).$$

The period $\Delta t_1$, in which the mobile station was in the frequency-changing state 22 which is characterized by the fact that PLL did not yet operate synchronously with a selected carrier frequency, can be determined as follows:

$$\Delta t_1 = \Delta_1 \times t_{settle} \quad (5),$$

where $t_{settle}$ specifies the pull-in period of the PLL with a frequency change. The pull-in period $t_{setttle}$ is determined by the characteristic quantities of the PLL, bandwidth and attenuation and is already stored in the memory when the method is applied.

The characteristic quantity $\Delta_5$ or period $\Delta t_5$ of the low-energy mode 24 in which the processor is supplied with reduced or disconnected clock and/or reduced or disconnected voltage is thus obtained indirectly from $\Delta t_1$, $\Delta t_2$, $\Delta t_3$ and $\Delta t_4$ via:

$$\Delta_5 = \Delta t_5 = \Delta t - (\Delta t_1 + \Delta t_2 + \Delta t_3 + \Delta t_4) \quad (6).$$

The charge $\Delta Q$ consumed in the observation period $\Delta t$ is thus calculated in the processor 5, with access to the quantities $i_k$ stored in the memory 6, as follows:

$$\Delta Q = \Delta t_1 \times i_1 + \Delta t_2 \times i_2 + \Delta t_3 \times i_3 + \Delta t_4 \times i_4 + \Delta t_5 \times i_5 \quad (7),$$

where the quantities $i_k$ specify the state-dependent typical currents of the respective states.

Figure 4:
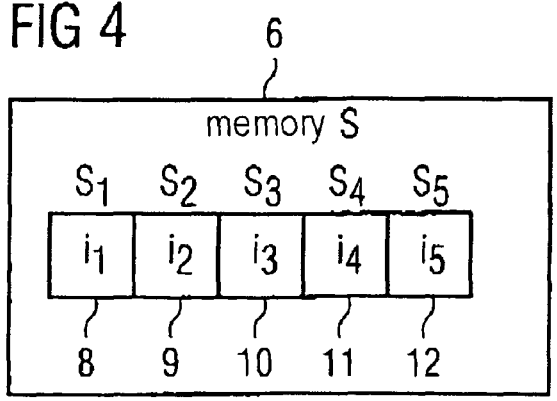
FIG. 4 is a schematic block diagram illustrating a representation of a memory with 5 storage cells $S_1$-$S_5$ with state-dependent typical currents $i_1$-$i_5$ stored therein.

FIG. 4 illustrates the occupancy of the memory 6 with the state-dependent typical currents $i_k$. The corresponding state-dependent typical currents $i_1$-$i_5$, which are used by the processor 6 in the calculation of the power consumption, are stored in the memory cells $S_1$-$S_5$ 8-12.

The calculation according to equation (7) can be simplified if the typical currents $i_3$ and $i_4$ are proportional to one another at different symbol rates (case 2.) and the proportionality is utilized by a proportionality factor P with $i_4=P \times i_3$ in the calculation in b).

Moreover, the mean power consumption $I_{mean}$ in the period $\Delta t$ can be calculated in addition to the calculation in equation (7). This is determined as:

$$T_{mean}=\Delta Q/\Delta t \qquad (8).$$

It is pointed out that when normalized quantities $\Delta t_k/\Delta t$ are used instead of $\Delta t_k$ or $i_k/\Delta t$ instead of $i_k$, $i_{mean}$ can also be determined directly from equation (7) without first determining the charge quantity $\Delta Q$.

Although the invention has been illustrated and described with respect to one or more examples, equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure. In addition, while a particular feature may have been disclosed with respect to only one example, such feature may be combined with one or more other features as may be desired and advantageous for any given or particular application. Furthermore, to the extent that the term "includes" is used in either the detailed description or the claims, such term is intended to be inclusive in a manner similar to the term "comprising." Also, "exemplary" is merely intended to mean an example, rather than "the best".

The invention claimed is:

1. A method for calculating a consumed charge Q referred to a period $\Delta t$ in a mobile device with mains-independent power supply configured to be in different system states in the period $\Delta t$, comprising:
   determining a period of a receiving/transmitting state in which the mobile device is in a transmitting state or in a receiving state in the period $\Delta t$;
   reading out a stored predetermined current value for a current of the receiving/transmitting state from a memory, wherein the stored predetermined current value read out from the memory is dependent on at least one of supply voltage, temperature or component tolerances; and
   multiplying the stored predetermined current value with the determined period in order to calculate the consumed charge Q for the receiving/transmitting state occurring in the period $\Delta t$.

2. The method of claim 1, in which the system states have a further receiving/transmitting state in which the mobile device, in the period $\Delta t$, operates in a transmitting state or in a receiving state with a further data rate which differs from a data rate in the receiving/transmitting state, the method further comprising:
   determining a further period in which the mobile device, in the period $\Delta t$, is in the further receiving/transmitting state with the further data rate;
   deriving a further current value for a current of the further receiving/transmitting state from the current value of the receiving/transmitting state by using a data-rate-dependent proportionality between the current value and the further current value; and
   multiplying the derived current value by the further period determined, in order to calculate the consumed charge Q for the further receiving/transmitting state occurring in the period $\Delta t$.

3. The method of claim 2, wherein the system states exhibit a frequency-changing state in which a change of the carrier frequency is carried out in the period $\Delta t$, the method further comprising:
   determining a further period in which the mobile device, in the period $\Delta t$, is in the frequency-changing state;
   reading out a further stored predetermined current value for a current of the frequency-changing state from a memory;
   multiplying the further stored predetermined current value by the further period in order to calculate the consumed charge Q for the frequency-changing state occurring in period $\Delta t$.

4. The method of claim 3, in which the period of the frequency-changing state is determined by counting the frequency-changing states occurring over the period $\Delta t$ or by measuring the period, in which the mobile device is in a frequency-changing state, occurring over the period $\Delta t$.

5. The method of claim 1, in which in the step of determining the period of the receiving/transmitting state, a number of the symbols, bits or chips received or transmitted in the period $\Delta t$ is determined in the receiving/transmitting state.

6. The method of claim 1, wherein the system states exhibit a low-energy state, the method further comprising:
   determining a period of the low-energy state in which the mobile device is in the period $\Delta t$, from a difference between the period $\Delta t$ and the period in which the mobile device is in the receiving/transmitting state;
   reading out a further stored predetermined current value for a current of the low-energy state from a memory; and
   multiplying the further stored predetermined current value by the further period in order to calculate the consumed charge Q for the low-energy state occurring in the period $\Delta t$.

7. The method of claim 6, in which the period of the inactive state is determined by measuring the period $\Delta t_k$ in which the mobile station is in an inactive system state occurring over the period $\Delta t$.

8. The method of claim 6, in which the period of the low-energy state is determined after determining the periods for other states occurring in the period $\Delta t$, by forming the difference between the period $\Delta t$ and the periods of other system states occurring in the period $\Delta t$.

9. The method of claim 1, where calculating the consumed charge Q referred to the period $\Delta t$ comprises:
   multiplying the respective state-dependent period by the associated state-dependent current, and
   adding the products resulting from the multiplications.

10. The method of claim 9, in which in the step of calculating the consumed charge Q, referred to the period $\Delta t$, a mean power consumption is determined by dividing the aggregate value obtained during the summation by the period $\Delta t$.

11. The method of claim 1, which is used for precalculating the residual operating time.

12. The method of claim 1, wherein the method is used in at least one of a Bluetooth, DECT or WLAN mobile station.

13. A method for calculating a consumed charge Q referred to a period $\Delta t$ in a mobile device with mains-independent power supply, configured to be in different system states in the period Δt, in which the system states exhibit a receiving/transmitting state in which the mobile device operates in a receiving state and in a transmitting state in the period Δt, and a frequency-changing state in which the carrier frequency is changed in the period Δt, the method comprising:

determining a first period in which the mobile device is in the transmitting state in the period Δt;

determining a second period in which the mobile device is in the receiving state in the period Δt;

determining a third period in which the mobile device is in the frequency-changing state in the period Δt;

reading out a stored predetermined first current value for a current of the transmitting state from a memory;

reading out a stored predetermined second current value for a current of the receiving state from a memory;

reading out a stored predetermined third current value for a current of the frequency-changing state from a memory; and multiplying the first, second and third predetermined current values by the first, second and third periods to calculate the consumed charge Q for the transmitting, receiving and frequency-changing state occurring in the period Δt.

14. A circuit arrangement for calculating a consumed charge Q in a period Δt in a mobile device with mains-independent power supply configured to be in different system states, comprising:

a determining means configured to determine a period of a transmitting/receiving state in which the mobile device is in a transmitting state or in a receiving state in the period Δt;

a memory for storing a stored predetermined current value for a current of the receiving/transmitting state, wherein the stored predetermined current value is dependent on at least one of supply voltage, temperature or component tolerances; and a calculating means configured to read out the stored predetermined current value from the memory and multiply the stored predetermined current value by the period determined, to calculate the consumed charge Q for the receiving/transmitting state occurring in the period Δt.

15. The circuit arrangement of claim 14, in which the determining means comprises at least one of a hardware or software counter.

16. The circuit arrangement of claim 14 in which the determining means is configured to calculate a period of a low-energy mode in the period Δt from a difference between the period Δt and periods of other system states occurring in the period Δt, wherein a processor is supplied with reduced or disconnected clock and/or reduced or disconnected voltage in the low-energy mode.

17. The circuit arrangement of claim 14, wherein the arrangement is used in a Bluetooth, DECT or WLAN mobile station.

18. A method for calculating a consumed charge Q referred to a period in a mobile device with mains-independent power supply configured to be in different system states in the period, the system states comprising a receiving/transmitting state where the mobile device operates in a receiving mode or a transmitting mode, a receiving state, in which the mobile device operates in a receiving mode, and/or a transmitting state, in which the mobile device operates in a transmitting mode, comprising:

determining a number of received and/or transmitted symbols, bits and/or chips in a system state of the different system states, the number comprising a characteristic of the length of period of the system state occurring in the period;

reading out a stored predetermined current value for a current of the system state from a memory; and multiplying the stored predetermined current value with the determined number to calculate the consumed charge for the system state occurring in the period.

19. A circuit arrangement for calculating a consumed charge referred to a period in a mobile device with mains-independent power supply configured to be in different system states in the period, the system states comprising a receiving/transmitting state where the mobile device operates in a receiving mode or a transmitting mode, a receiving state, in which the mobile device operates in a receiving mode, and/or a transmitting state, in which the mobile device operates in a transmitting mode, comprising:

a determining means configured to determine a number of received and/or transmitted symbols, bits and/or chips in a system state of the different system states, the number comprising a characteristic of the length of period of the system state occurring in the period;

a memory for storing a stored predetermined current value for a current of the receiving/transmitting state; and a calculating means configured to read out the stored predetermined current value from the memory and multiply the stored predetermined current value by the period determined, to calculate the consumed charge for the receiving/transmitting state occurring in the period.

\* \* \* \* \*